United States Patent
Na et al.

(10) Patent No.: US 8,748,286 B2
(45) Date of Patent: Jun. 10, 2014

(54) METHOD OF FABRICATING A NONVOLATILE MEMORY DEVICE

(75) Inventors: Jong-Hoon Na, Seongnam-si (KR); Young-Woo Park, Seoul (KR); Dong-Hwa Kwak, Suwon-si (KR); Tae-Yong Kim, Osan-si (KR); Jee-Hoon Han, Hwaseong-si (KR); Jang-Hyun You, Seoul (KR); Dong-Sik Lee, Yongin-si (KR); Su-Jin Park, Goyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 347 days.

(21) Appl. No.: 13/198,157

(22) Filed: Aug. 4, 2011

(65) Prior Publication Data
US 2012/0122297 A1 May 17, 2012

(30) Foreign Application Priority Data
Nov. 15, 2010 (KR) .................. 10-2010-0113349

(51) Int. Cl.
*H01L 21/76* (2006.01)
*H01L 29/00* (2006.01)

(52) U.S. Cl.
USPC ........... 438/411; 438/421; 438/422; 438/424; 438/435; 257/501; 257/506; 257/510; 257/522

(58) Field of Classification Search
USPC ......... 438/404, 411, 421, 422, 424, 435–437; 257/499, 501, 506, 510, 522
See application file for complete search history.

(56) References Cited

U.S. PATENT DOCUMENTS 7,807,563 B2 * 10/2010 Gabric et al. ................. 438/619

FOREIGN PATENT DOCUMENTS

| JP | 2008-283095 | 11/2008 |
|----|-------------|---------|
| JP | 2009-206152 | 9/2009 |
| JP | 2010-027922 | 2/2010 |

* cited by examiner

*Primary Examiner* — Hsien Ming Lee
(74) *Attorney, Agent, or Firm* — Lee & Morse, P.C.

(57) ABSTRACT

A method of fabricating a nonvolatile memory device includes providing a substrate having active regions defined by a plurality of trenches, forming a first isolation layer on the substrate having the plurality of trenches, forming a sacrificial layer on the first isolation layer to fill the trenches, the sacrificial layer including a first region filling lower portions of the trenches and a second region filling portions other than the lower portions, removing the second region of the sacrificial layer, forming a second isolation layer on the first isolation layer and the first region of the sacrificial layer, forming air gaps in the trenches by removing the first region of the sacrificial layer, and removing a portion of the first isolation layer and a portion of the second isolation layer while maintaining the air gaps.

19 Claims, 8 Drawing Sheets

METHOD OF FABRICATING A NONVOLATILE MEMORY DEVICE

BACKGROUND

1. Field

Embodiments relate to a method of fabricating a nonvolatile memory device.

2. Description of the Related Art

A nonvolatile memory integrated circuit device retains stored data even in the event of power interruption. Therefore, the nonvolatile memory integrated circuit device is widely used in information communication devices such as digital cameras, cellular phones, personal digital assistants (PDA), or MP3 players.

SUMMARY

An embodiment is directed to a method of fabricating a nonvolatile memory device, the method including providing a substrate having active regions defined by a plurality of trenches, forming a first isolation layer on the substrate having the plurality of trenches, forming a sacrificial layer on the first isolation layer to fill the trenches, the sacrificial layer including a first region filling lower portions of the trenches and a second region filling portions other than the lower portions, removing the second region of the sacrificial layer, forming a second isolation layer on the first isolation layer and the first region of the sacrificial layer, forming air gaps in the trenches by removing the first region of the sacrificial layer, and removing a portion of the first isolation layer and a portion of the second isolation layer while maintaining the air gaps.

The forming of the air gaps in the trenches may include forming the air gaps such that another portion of the first isolation layer and another portion of the second isolation layer surround the air gaps.

The method may further include, after the removing the portion of the first isolation layer and the portion of the second isolation layer, forming a second dielectric layer and word lines on another portion of the first isolation layer and another portion of the second isolation layer.

The removing of the first region of the sacrificial layer may include selectively removing the sacrificial layer using etching selectivity between the sacrificial layer and the second isolation layer.

The providing of the substrate may include sequentially stacking a first dielectric layer on the active regions and on a charge storage floating pattern.

The removing of the first region of the sacrificial layer may include selectively removing the sacrificial layer using first etching selectivity between the sacrificial layer and the second isolation layer and second etching selectivity between the sacrificial layer and the charge storage floating pattern.

The forming of the sacrificial layer may include forming the sacrificial layer using a spin on hardmask or a silicon nitride layer.

The providing of the substrate may include providing the substrate including at least two cell blocks, and the removing of the first region of the sacrificial layer may include forming a mask pattern including an open region defined between the two cell blocks, exposing a portion of the sacrificial layer by removing the second isolation layer using the mask pattern as an etch mask, and forming air gaps in the trenches by removing the first region of the sacrificial layer through the open region.

Another embodiment is directed to a method of fabricating a nonvolatile memory device, the method including providing a substrate having active regions defined by a plurality of trenches and including at least two cell blocks, forming a first isolation layer on the substrate, forming a sacrificial layer on the first isolation layer to fill the plurality of trenches, the sacrificial layer including a first region filling lower portions of the trenches and a second region filling portions other than the lower portions, removing the second region of the sacrificial layer, forming a second isolation layer on the first isolation layer and on the first region of the sacrificial layer, forming a mask pattern on the substrate, the mask pattern including an open region defined between the at least two cell blocks, exposing a portion of the sacrificial layer by removing the second isolation layer using the mask pattern as an etch mask, forming air gaps in the trenches by removing the first region of the sacrificial layer through the open region of the mask pattern, and forming a third isolation layer on the substrate to fill some of the plurality of trenches corresponding to the open region.

The method may further include, after the filling of some of the trenches corresponding to the open region, removing a first portion of the first isolation layer and a first portion of the second isolation layer while maintaining the air gaps.

The forming of the air gaps in the trenches may include forming the air gaps such that a second portion of the first isolation layer and a second portion of the second isolation layer surround the air gaps.

The method may further include, after the removing the first portion of the first isolation layer and the first portion of the second isolation layer, forming a second dielectric layer and word lines on the second portion of the first isolation layer and the second portion of the second isolation layer.

The removing of the first region of the sacrificial layer may include selectively removing the sacrificial layer using etching selectivity between the sacrificial layer and the second isolation layer.

The providing of the substrate may include sequentially stacking a first dielectric layer on the active regions and a charge storage floating pattern.

The removing of the first region of the sacrificial layer may include selectively removing the sacrificial layer using a first etching selectivity between the sacrificial layer and the second isolation layer and a second etching selectivity between the sacrificial layer and the charge storage floating pattern.

The forming of the sacrificial layer may include forming the sacrificial layer using a silicon hydrogen oxide or silicon nitride layer.

Another embodiment is directed to a method of fabricating a memory device, including forming a first trench and a second trench in a substrate, forming a first insulating layer that covers interior surfaces of the first and second trenches, the first and second trenches with the first insulating layer therein defining respective voids below an upper surface of the substrate, forming a sacrificial material layer, the sacrificial material layer being formed in the first trench such that the first insulating layer is between the sacrificial material layer and a wall of the first trench, the sacrificial material layer being formed in the second trench such that the first insulating layer is between the sacrificial material layer and a wall of the second trench, the sacrificial material layer at least partially filling the voids, covering the first and second trenches with a second insulating layer, the second insulating layer entirely covering upper surfaces of the sacrificial material layer in the first and second trenches, and removing the sacrificial material layer from the first and second trenches so as to form air gaps in the first and second trenches, the sacrificial material layer being removed from the second trench while the second trench is covered with the second insulating layer such that the air gap in the second trench is below the second insulating layer.

The method may further include covering the second insulating layer with a mask that has an opening over the first trench, and etching the second insulating layer so as to remove the second insulation layer above the first trench using the mask.

Removing the second insulating layer above the first trench using the mask may be performed before removing the sacrificial layer from the first and second trenches.

Removing the second insulating layer above the first trench may include partially removing the second insulating layer from above the second trench such that the air gap in the second trench remains covered with a portion of the second insulating layer.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
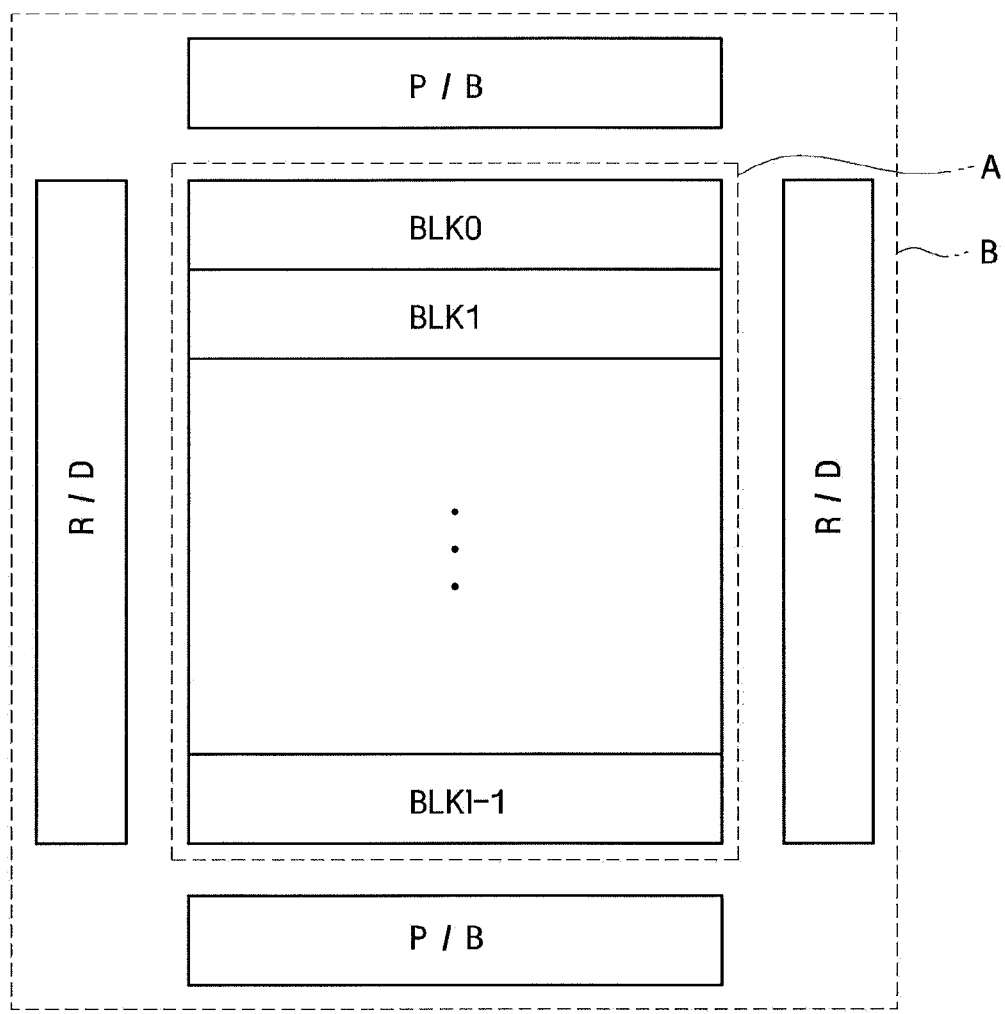
FIG. 1 illustrates a block diagram of a NAND-type nonvolatile semiconductor integrated circuit device including transistors according to an example embodiment.

Korean Patent Application No. 10-2010-0113349, filed on Nov. 15, 2010, in the Korean Intellectual Property Office, and entitled: "Fabricating Method of Nonvolatile Memory Device and Nonvolatile Memory Device Fabricated Thereby," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc., may be used herein to describe various elements, these elements should not be limited by these terms. These terms are only used to distinguish one element from another element. Thus, for example, a first element, a first component, or a first section discussed below could be termed a second element, a second component, or a second section.

Embodiments described herein may be described referring to plan views and/or cross-sectional views by way of ideal schematic views of the invention. Accordingly, the example views may be modified depending on manufacturing technologies and/or tolerances. Therefore, embodiments are not limited to those shown in the views, but include modifications in configuration formed on the basis of manufacturing processes. Therefore, regions exemplified in figures have schematic properties and shapes of regions shown in figures exemplify specific shapes of regions of elements, and not intended to be limiting.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a method of fabricating a nonvolatile memory device according to example embodiments and nonvolatile memory devices fabricated thereby will be described with reference to FIGS. 1 to 13.

Figure 2:
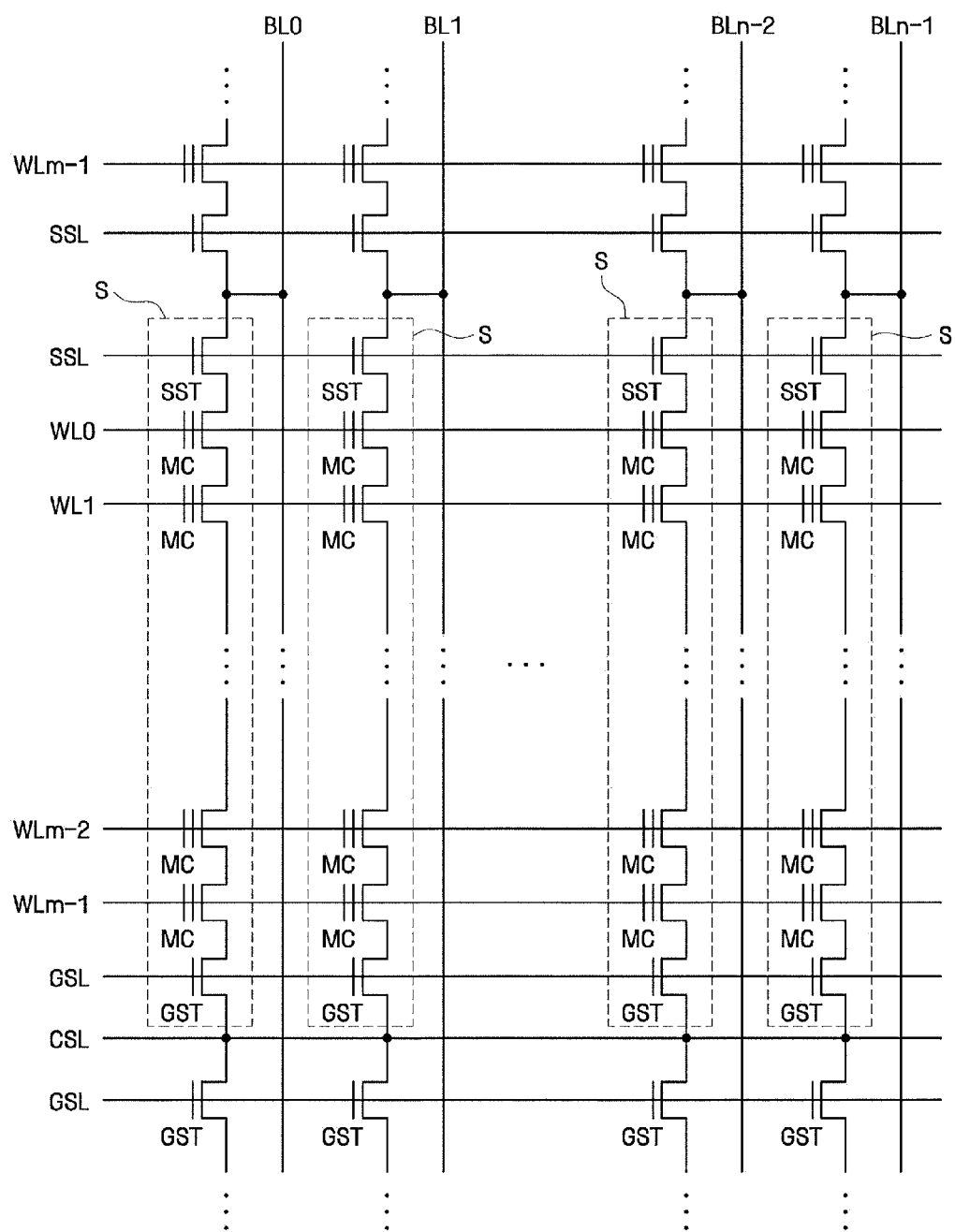
FIG. 2 illustrates a circuit diagram of a cell array region of FIG. 1.
Figure 3:
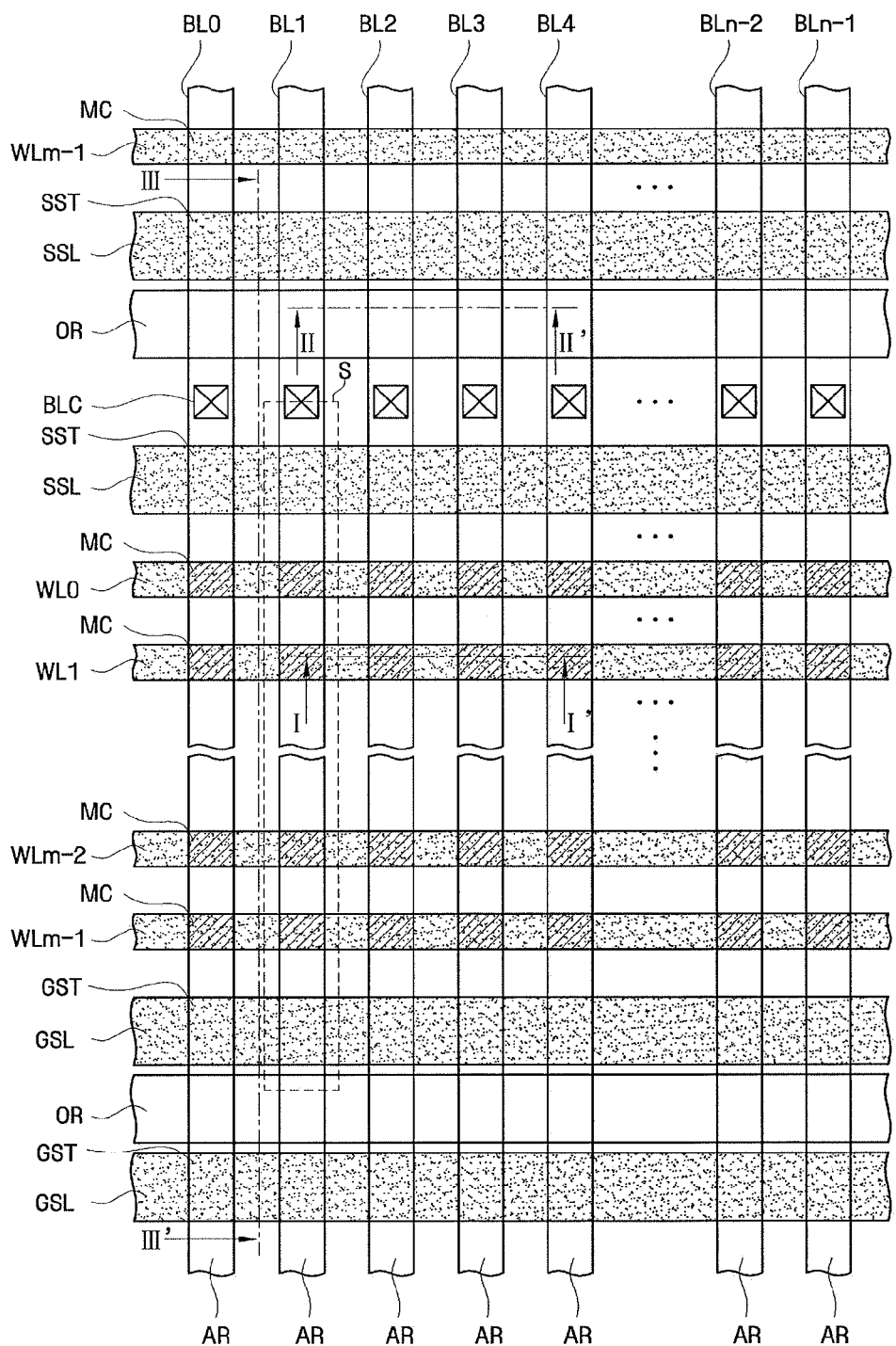
FIG. 3 illustrates a layout view of a cell array region of FIG. 1.

First, a nonvolatile memory device in accordance with embodiments will be described with reference to FIGS. 1 to 5. FIG. 1 illustrates a block diagram of a NAND-type nonvolatile semiconductor integrated circuit device, to which transistors in accordance with embodiments are applied. FIG. 2 illustrates a circuit diagram of a cell array region of FIG. 1. FIG. 3 illustrates a layout view of a cell array region of FIG. 1.

Referring to FIGS. 1 to 3, in the NAND-type nonvolatile semiconductor integrated circuit device, cell blocks, e.g., cell blocks BLK0~BLKl-1, may be repeatedly arranged in a cell array region A. Active regions ARs may be arranged in each of the cell blocks BLK0~BLKl-1, and string select lines SSLs, ground select lines GSLs and a common source line CSL may be arranged to be perpendicular to the active regions ARs. Word lines WL0~WLm-1 may be arranged between the string select lines SSLs and the ground select lines GSLs. In addition, bit lines BL0~BLn-1 may be arranged to cross the plurality of word lines WL0~WLm-1.

Memory cell transistors MCs may be defined at intersections of the bit lines BL0~BLn-1 and the word lines WL0~WLm-1. String select transistors SSTs and ground select transistors GSTs may be defined at intersections of the bit lines BL0~BLn-1 and the string select lines SSLs, and at intersections of the bit lines BL0~BLn-1 and the ground select lines GSLs, respectively. The string select transistors SSTs, the plurality of memory cell transistors MCs, and the ground select transistors GSTs may be serially connected to form a string S. Strings S formed in the respective cell blocks BLK0~BLKl-1 may be connected to each other in parallel for the plurality of bit lines BL. For example, drains of the string select transistors SSTs in each string S may be connected to the respective bit lines BL. Sources of the ground select transistors GSTs may be connected to the common source line CSL.

Referring to FIG. 3, open regions ORs may be disposed between two adjacent cell blocks. The open regions ORs may be defined for removing a sacrificial layer (not shown), and may correspond to regions where air gaps 154 are not formed.

For example, as shown in FIG. 3, the open regions ORs may be disposed on the regions where a plurality of signal lines extending in a first direction, for example, the plurality of word lines WL0~WLm-1, the string select lines SSLs, and the ground select lines GSLs are not arranged. In an implementation, the open regions ORs may be arranged between adjacent string select lines SSLs or between adjacent ground select lines GSLs.

Referring again to FIG. 1, page buffers P/B may be provided in top and bottom portions of a peripheral circuit region B, and row decoders R/D may be provided in the left and right sides of the peripheral circuit region B.

Figure 4:
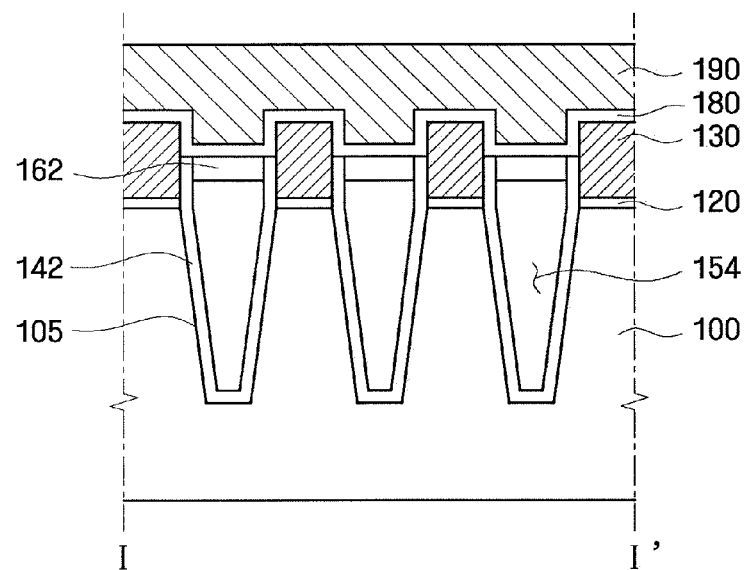
FIG. 4 illustrates a cross-sectional view of a NAND-type nonvolatile memory device in accordance with an example embodiment, taken along the line I-I' of FIG. 3.
Figure 5:
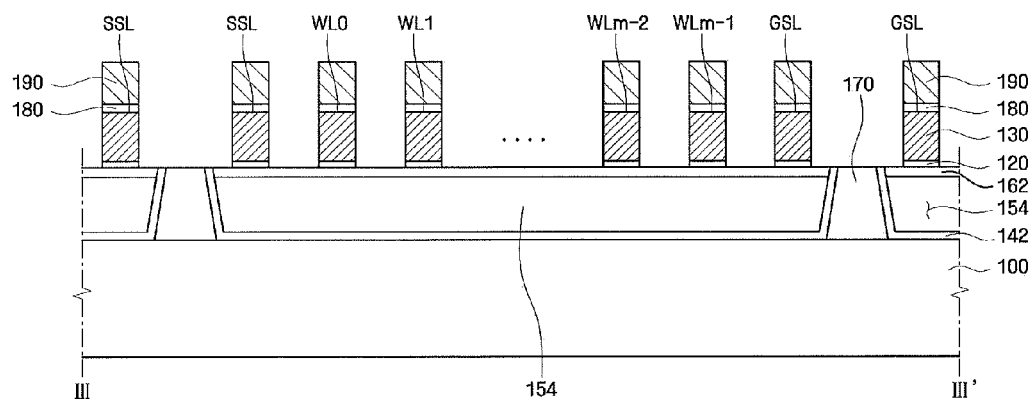
FIG. 5 illustrates a cross-sectional view of a NAND-type nonvolatile memory device in accordance with an example embodiment, taken along the line III-III' of FIG. 3.

FIGS. 4 and 5 illustrate cross-sectional views of a NAND-type nonvolatile memory device in accordance with an embodiment, in which FIG. 4 is a cross-sectional view taken along the line I-I' of FIG. 3 and FIG. 5 is a cross-sectional view taken along the line III-III' of FIG. 3.

Referring FIGS. 2 to 5, a substrate 100 may have active regions defined by a plurality of trenches 105. The substrate 100 may be made of one or more semiconductor substances, e.g., Si, Ge, SiGe, GaP, GaAs, SiC, SiGeC, InAs, InP, etc. In an implementation, the substrate 100 may be an SOI substrate.

The substrate 100 may include two or more cell blocks. The substrate 100 may have a cell array region and a peripheral circuit region defined therein. In the cell array region, active regions ARs may be repeatedly arranged. The substrate 100 may include a plurality of wells (not shown) for optimizing characteristics of transistors formed in the cell array region and the peripheral circuit region. For example, pocket-type p wells may be formed in the cell array region, and n- and p-type wells may be formed in the peripheral circuit region.

Gate structures may be formed on the cell array region. The gate structures may correspond to gate of the memory cell transistors MCs. The memory cell transistors MCs and the string select transistors SSTs or the ground select transistors GSTs may be formed on the cell array region. Driving transistors (not shown) may be formed on the peripheral circuit region. Each of the gate structures may include a first dielectric layer 120, a charge storage floating pattern 130, a second dielectric layer 180, and a word line 190, which are sequentially stacked.

As shown in FIG. 4, the first dielectric layer 120 and the charge storage floating pattern 130 are sequentially stacked on the substrate 100. The first dielectric layer 120 and the charge storage floating pattern 130 may be formed in substantially the same pattern as the active region AR. The first dielectric layer 120 may be formed using a material to a thickness to be suitable for electron tunneling. For example, the first dielectric layer 120 may be formed of a single layer or a composite layer made of one or more of $SiO_2$, $Hf_xO_y$, $Al_xO_y$, $Zr_xO_y$, $Ta_xO_y$, $Hf_xSi_{1-x}O_y$, $Hf_xSi_{1-x}O_yN_z$, etc.

In the example embodiment shown in FIG. 4, the charge storage floating pattern 130 is a region where electrons that tunnel through the first dielectric layer 120 are stored. In a case where a floating gate type nonvolatile semiconductor integrated circuit device is to be formed, the charge storage floating pattern 130 may be made of doped polysilicon. In a case where a floating trap type nonvolatile semiconductor integrated circuit device (such as a metal oxide nitride oxide semiconductor (MONOS) or a semiconductor oxide nitride oxide semiconductor (SONOS)) is to be formed, the charge storage floating pattern 130 may be made of a material capable of trapping electrons, such as SiN, BN, or SiBN. In the latter case, the charge storage floating pattern 130 may be non-conductive and may be formed lower than the pattern shown herein.

The second dielectric layer 180 may be an intergate insulating layer, and may prevent charges stored in the charge storage floating pattern 130 from moving toward the word line 190. The second dielectric layer 180 may be formed of a single layer or a composite layer made of one or more of $SiO_2$, ONO, $Hf_xO_y$, $Al_xO_y$, $Zr_xO_y$, $Ta_xO_y$, $Hf_xSi_{1-x}O_y$, $Hf_xSi_{1-x}O_yN_z$, etc. The second dielectric layer 180 may be formed on a second isolation layer 162 and the charge storage floating pattern 130. The word lines 190 may be formed on the second dielectric layer 180.

In the example embodiment shown in FIG. 4, an air gap 154 is formed in each of the trenches 105, and the air gap 154 is surrounded by a first isolation layer 142 and the second isolation layer 162. The first isolation layer 142 and the second isolation layer 162 may be formed on a bottom surface and sidewalls of the trench 105 and under the second dielectric layer 180, and the air gap 154 may be formed in the trench 105. As shown, the first isolation layer 142 may be formed along the bottom surface and sidewalls of the trench 105. The second isolation layer 162 may be formed of two or more material layers according to the process technique.

FIG. 5 illustrates a cross-sectional view taken along a direction in which the plurality of bit lines BL0~BLn-1 is extended. As shown in FIG. 5, the air gap 154 may be formed along a device isolation region. In an embodiment, the air gap 154 may be formed in the trench 105 for defining the device isolation region. Thus, the air gap 154 may be disposed in a portion of the device isolation region.

As described above, the open region OR may be disposed between adjacent string select lines SSLs or between adjacent ground select lines GSLs. A region corresponding to the open region OR may be filled with an insulating material. Accordingly, the region of the trench 105 corresponding to the open region OR may be filled by the first isolation layer 142 and the second isolation layer 162. A portion of the trench 105, for example, the open region OR, may be filled with an insulating material, and the air gap 154 may be formed in a portion other than the open region OR.

Next, a fabricating method of a NAND-type nonvolatile memory device in accordance with an embodiment will be described with reference to FIGS. 6 to 13. FIGS. 6 to 13 illustrate cross-sectional views of various intermediate structures for explaining a fabricating method of a NAND-type nonvolatile memory device in accordance with an embodiment. A description of elements similar to those of the previous embodiment described above will be omitted or simplified.

Figure 6:
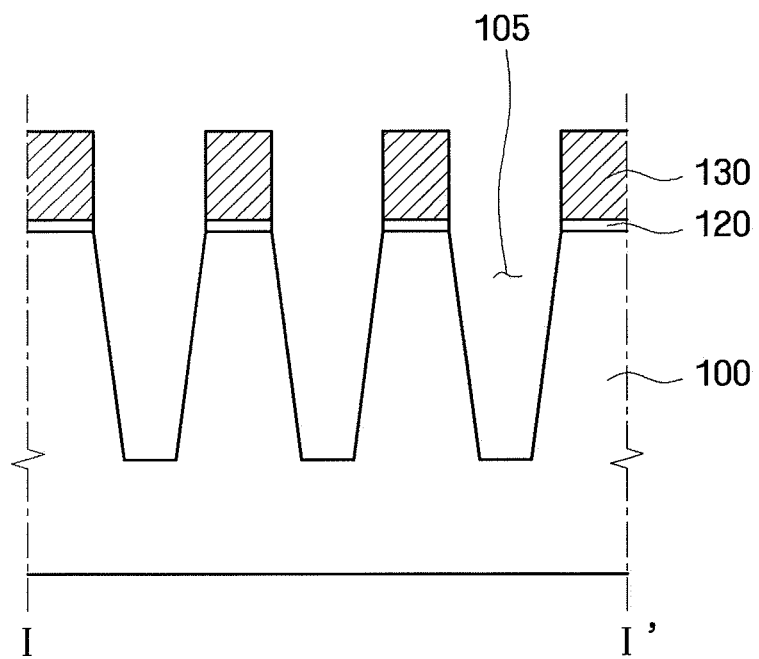
FIGS. 6 to 13 illustrate cross-sectional views of stages in a method of fabricating a NAND-type nonvolatile memory device in accordance with an example embodiment.

First, referring to FIG. 6, the substrate 100 is provided, the substrate 100 having active regions defined by the plurality of trenches 105. The first dielectric layer 120 and the charge storage floating pattern 130 may be sequentially stacked on the active regions of the substrate 100.

In an implementation, a material for forming a first dielectric layer pattern may be stacked on the active region of the substrate 100 using, for example, chemical vapor deposition (CVD), thereby forming a first dielectric layer pattern forming layer (not shown). The material for forming the first dielectric layer pattern may be, for example, $Hf_xSi_{1-x}O_y$, etc.

Next, a material for forming a charge storage floating pattern may be stacked on the first dielectric layer pattern forming layer using, for example, chemical vapor deposition (CVD), thereby forming a charge storage floating pattern forming layer (not shown). The material for forming the charge storage floating pattern may be, for example, polysilicon, etc.

Next, the first dielectric layer pattern forming layer and the charge storage floating pattern forming layer may be patterned by photolithography. At this stage, the plurality of trenches 105 defining the active regions may be formed.

Figure 7:
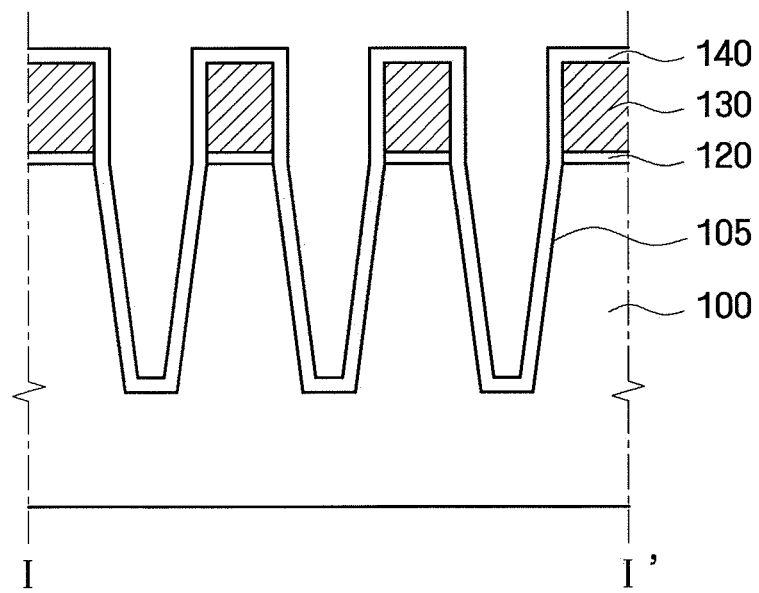

Referring to FIG. 7, a first isolation layer 140 may be formed on the substrate 100 including the plurality of trenches 105.

The first isolation layer 140 may be conformally formed by, for example, CVD, on the inner walls and bottom surfaces of the plurality of trenches 105, the first dielectric layer 120 patterned on the substrate 100 and the charge storage floating pattern 130. The first isolation layer 140 may be made of an insulating material.

Figure 8:
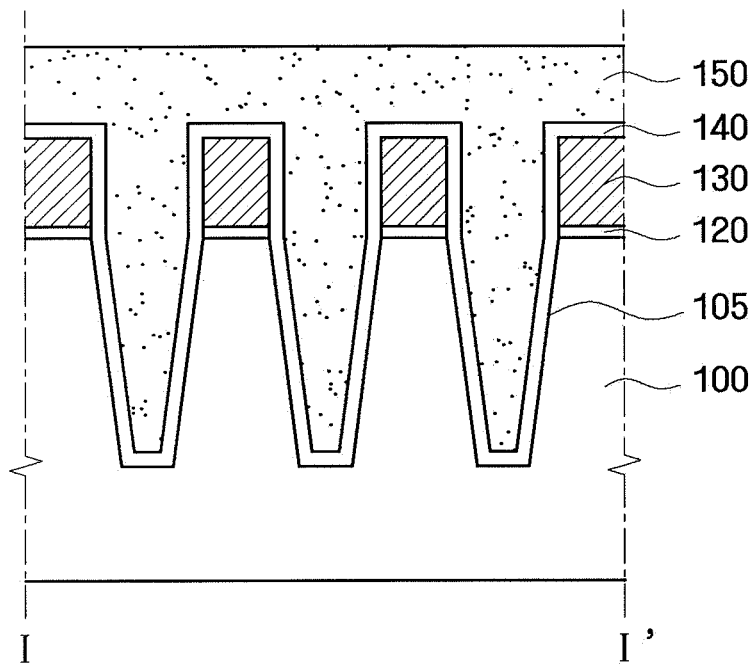

Referring to FIG. 8, a sacrificial layer 150 may be formed on the first isolation layer 140 to fill the plurality of trenches 105.

The sacrificial layer 150 may be formed by, for example, CVD. The sacrificial layer 150 may be formed on the first isolation layer 140 in the active regions having the first dielectric layer 120 and the charge storage floating pattern 130 while filling the plurality of trenches 105. The sacrificial layer 150 may be formed, for example, using a spin on hardmask (SOH) or a silicon nitride (SiN) layer.

The sacrificial layer 150 filling the plurality of trenches 105 may include a first region filling lower portions of the trenches 105, and a second region filling portions other than the lower portions.

Figure 9:
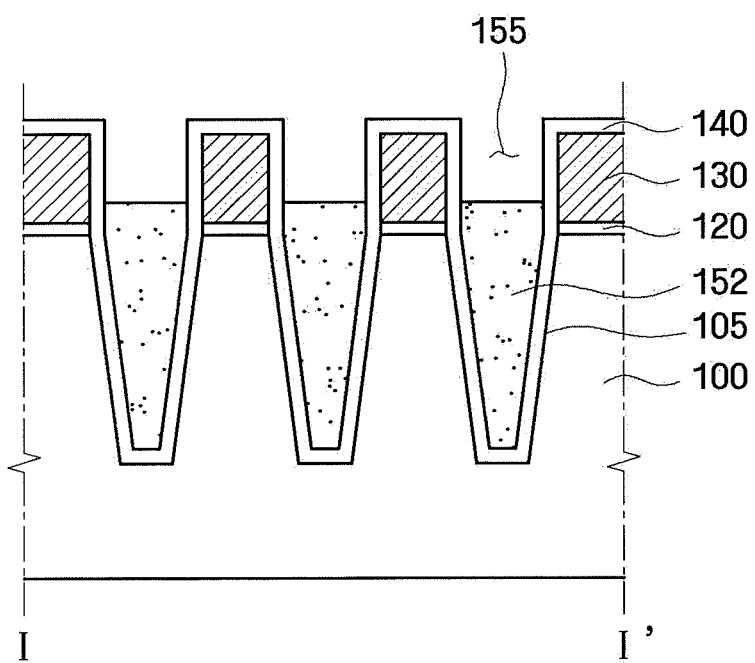

Referring to FIG. 9, the second region of the sacrificial layer (150 of FIG. 8) may be removed, leaving the first region.

For example, the sacrificial layer 150 formed at the portions other than the lower portions of the trenches 105 may be removed by, for example, an etch back process.

Accordingly, a recessed region 155 may be formed between the first dielectric layer 120 and the charge storage floating pattern 130.

The sacrificial layer 150 may be partially removed, such that it remains at a depth sufficient to form air gaps (154 of FIG. 4) in the trenches 105. In other words, a top surface of the first region of the remaining sacrificial layer 152, that is, a top surface of the sacrificial layer 152 from which the second region is removed, may be at the same plane as the top surface of the air gap 154 to be formed in a subsequent process.

Figure 10:
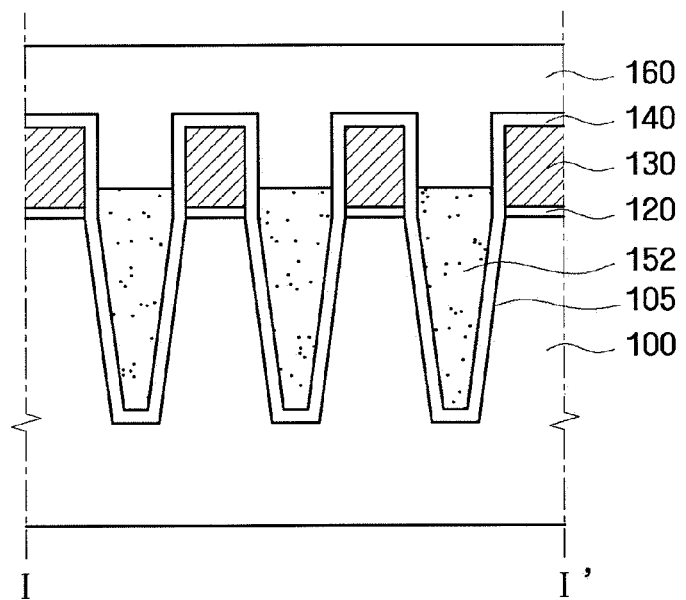

Referring to FIG. 10, a second isolation layer 160 is formed on the first isolation layer 140 and the first region of the sacrificial layer 152.

The second isolation layer 160 may be formed by, for example, atomic layer deposition (ALD). In addition, the second isolation layer 160 may be made of an insulating material, for example, oxide. Although not shown, the second isolation layer 160 may be made of a material having poorer step coverage than a third isolation layer (170 of FIG. 13) deposited in a subsequent process.

In addition, the second isolation layer 160 may be made of a material that is physically harder than the third isolation layer 170. When portions of first to third isolation layers 140, 160, and 170 are removed in subsequent processes, the air gap 154 surrounded by the first isolation layer 140 and the second isolation layer 160 should be maintained. Therefore, the second isolation layer 160 formed on the air gap 154 is preferably formed of a relatively hard material.

The second isolation layer 160 may fill the recessed region (155 of FIG. 9) formed between the first dielectric layer 120 and the charge storage floating pattern 130, and may be formed on the first isolation layer 140 and the first region of the sacrificial layer 152.

Figure 11:
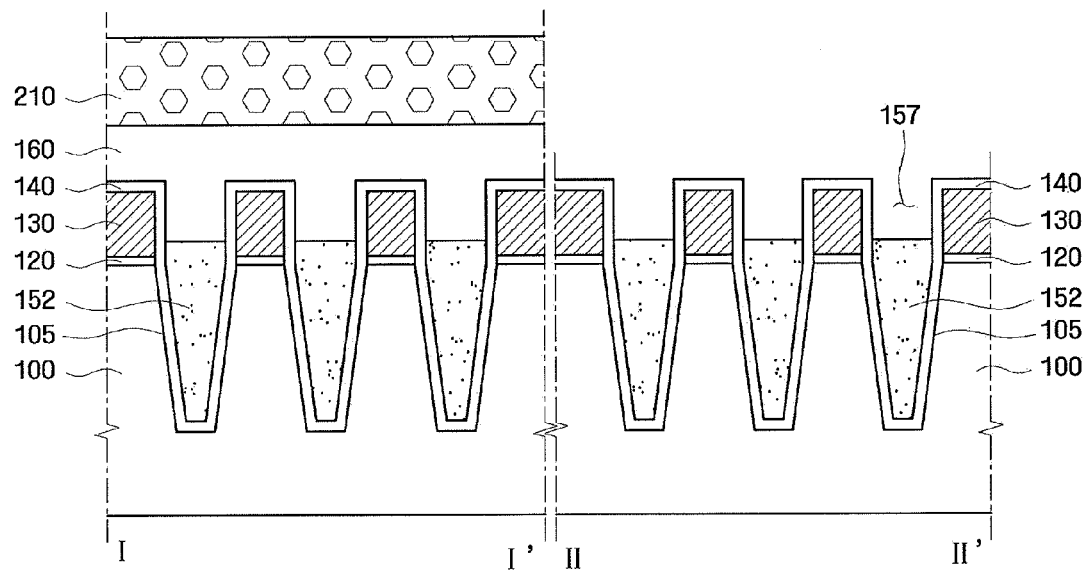

Referring to FIGS. 3 and 11, a mask pattern 210 including open regions OR is formed on the substrate 100, and the second isolation layer 160 is removed using the mask pattern 210 as an etch mask to expose a portion of the sacrificial layer 152.

In FIG. 11, the left drawing is a partial cross-sectional view of a cell block region, and the right drawing is a partial cross-sectional view of an open region OR. In other words, the left drawing of FIG. 11 is a cross-sectional view taken along the line I-I' of FIG. 3, and the right drawing of FIG. 11 is a cross-sectional view taken along the line II-II' of FIG. 3.

As shown in FIG. 11, the mask pattern 210 may be formed in the form of an opening in a region corresponding to the open region OR. Accordingly, the second isolation layer 160 may be removed using the mask pattern 210 as an etch mask. As a result of removing the second isolation layer 160 corresponding to the open region OR, the sacrificial layer 152 may be exposed in the region corresponding to the open region OR. However, the mask pattern 210 allows the second isolation layer 162 to remain in the region other than the open region OR. Thus, the sacrificial layer 152 may not be exposed in the region other than the open region OR.

The opening of the mask pattern 210 may be formed in the region corresponding to the open region OR of the substrate 100, to thereby allow selective removal of the second isolation layer 162 using the mask pattern 210 as an etch mask. Thus, the sacrificial layer 152 corresponding to the open region OR is exposed, while the sacrificial layer 152 is not exposed where the second isolation layer 162 remains in the region other than the open region OR.

Figure 12:
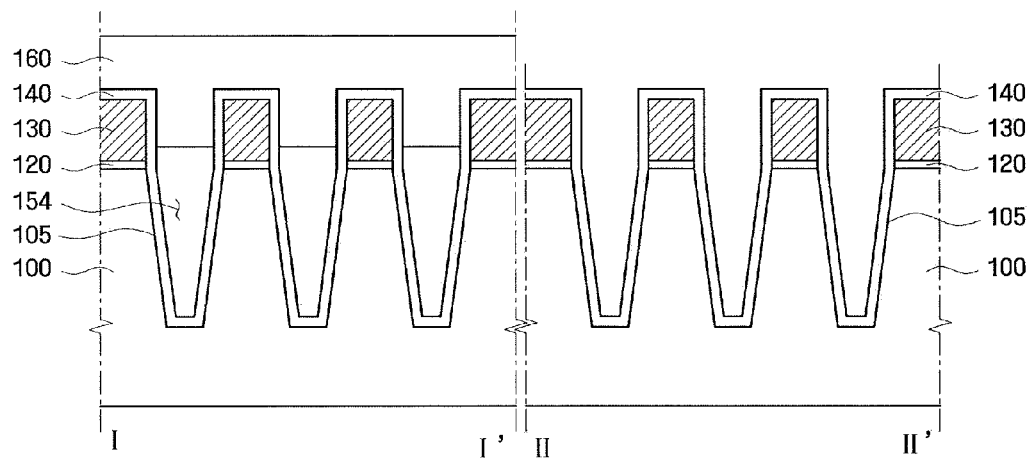

Referring to FIG. 12, air gaps 154 may be formed in the trenches 105 by removing the first region of the sacrificial layer 152.

The first region of the sacrificial layer 152 may be removed through the open region OR of the mask pattern 210. As described above, the sacrificial layer 152 in the region corresponding to the open region OR is not exposed by the second isolation layer 162, while the sacrificial layer 152 corresponding to the open region OR is exposed. The sacrificial layer 152 exposed through the open region OR and the sacrificial layer 152 in the non-exposed region may be removed by adjusting process conditions, including a process time and an etching gas.

The sacrificial layer 152 may be selectively removed using etching selectivity between the sacrificial layer 152 and the second isolation layer 162. In another implementation, the sacrificial layer 152 may be selectively removed using etching selectivity between the sacrificial layer 152 and the charge storage floating pattern 130. For example, in a case where the sacrificial layer 152 is formed using a spin on hardmask (SOH), the sacrificial layer 152 in the non-exposed region and the exposed region may be removed by ashing, or, in a case where the sacrificial layer 152 is formed using a silicon nitride layer, etching selectivity of the sacrificial layer 152 may be increased using phosphoric acid.

The sacrificial layer 152 in the open region OR and the sacrificial layer 152 in the region other than the open region OR may be removed. As shown in FIG. 12, the trenches 105 may be exposed in the open region OR, while the air gaps 154 surrounded by the first isolation layer 142 and the second isolation layer 162 may be formed in the trenches 105 of the non-open region.

Figure 13:
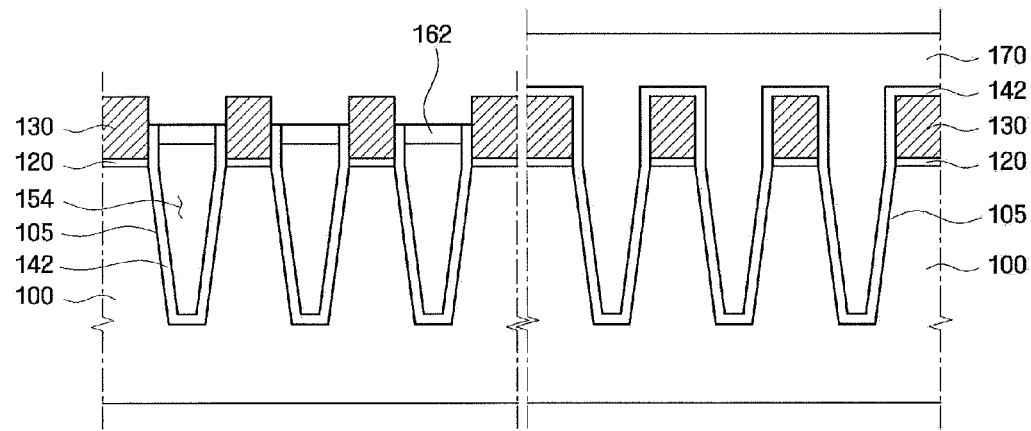

Referring to FIG. 13, the third isolation layer 170 may be formed on the substrate 100 to fill some of the plurality of trenches 105 in the open region OR.

The trenches 105 of the exposed open region OR may be filled with the third isolation layer 170 using, for example, CVD, after removing the sacrificial layer 152. As described above, the third isolation layer 170 may be made of a material having better step coverage and physically smoother than the second isolation layer 162.

Referring back to FIG. 4, at least a portion of the third isolation layer 170, at least a portion of the second isolation layer 162, and at least a portion of the first isolation layer 142 may be removed while maintaining the air gaps 154, and a second dielectric layer 180 and a plurality of word lines 190 may be sequentially formed on the air gaps 154 and the charge storage floating pattern 130.

The at least a portion of the third isolation layer 170, the at least a portion of the second isolation layer 162, and the at least a portion of the first isolation layer 142 may be removed, thereby exposing a portion of the charge storage floating pattern 130. The air gaps 154 may be protected by the first isolation layer 142 and the second isolation layer 162, thereby preventing the air gaps 154 from being damaged. While FIG. 4 illustrates that only the second isolation layer 162 is formed on the air gaps 154, a portion (not shown) of the third isolation layer 170 may remain on the second isolation layer 162 according to the removal extent of the third isolation layer 170.

In another implementation, a material for forming a second dielectric layer pattern may be stacked on the air gaps 154 and the charge storage layer pattern 160 using, for example, CVD, thereby forming the second dielectric layer 180. The material for forming a second dielectric layer pattern may be, for example, ONO, etc.

Next, the plurality of word lines 190 may be formed on the second dielectric layer 180 by, for example, CVD. The plurality of word lines 190 may be made of, for example, polysilicon.

By way of summation and review, nonvolatile memory integrated circuit devices of large capacity and high integration are increasingly desirable as information communication devices have become multi-functional and highly efficient. Thus, it is desirable to shrink sizes of memory cells constituting a nonvolatile memory integrated circuit device. The shrinking of the memory cell size may increase coupling of memory cells in a bit line direction. Accordingly, a dispersion of cells may increase, making it difficult to read memory cells. Thus, embodiments provide a method of fabricating a nonvolatile memory device having improved reliability and a nonvolatile memory device having improved reliability fabricated by the fabricating method.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a nonvolatile memory device, the method comprising:
    providing a substrate having active regions defined by a plurality of trenches;
    forming a first isolation layer on the substrate having the plurality of trenches;
    forming a sacrificial layer on the first isolation layer to fill the trenches, the sacrificial layer including a first region filling lower portions of the trenches and a second region filling portions other than the lower portions;
    removing the second region of the sacrificial layer;
    forming a second isolation layer on the first isolation layer and the first region of the sacrificial layer;
    forming air gaps in the trenches by removing the first region of the sacrificial layer; and
    removing a portion of the first isolation layer and a portion of the second isolation layer while maintaining the air gaps.

2. The method as claimed in claim 1, wherein the air gaps are formed such that a portion of the first isolation layer and a portion of the second isolation layer surround the air gaps.

3. The method as claimed in claim 1, further comprising, after the removing the portion of the first isolation layer and the portion of the second isolation layer, forming a second dielectric layer and word lines on a remaining portion of the first isolation layer and a remaining portion of the second isolation layer.

4. The method as claimed in claim 1, wherein the removing of the first region of the sacrificial layer comprises selectively removing the sacrificial layer using etching selectivity between the sacrificial layer and the second isolation layer.

5. The method as claimed in claim 1, wherein the providing of the substrate comprises sequentially stacking a first dielectric layer on the active regions and on a charge storage floating pattern.

6. The method as claimed in claim 5, wherein the removing of the first region of the sacrificial layer comprises selectively removing the sacrificial layer using first etching selectivity between the sacrificial layer and the second isolation layer and second etching selectivity between the sacrificial layer and the charge storage floating pattern.

7. The method as claimed in claim 1, wherein the forming of the sacrificial layer comprises forming the sacrificial layer using a spin on hardmask or a silicon nitride layer.

8. The method as claimed in claim 1, wherein:
    the providing of the substrate includes providing the substrate including at least two cell blocks, and
    the removing of the first region of the sacrificial layer includes forming a mask pattern including an open region defined between the two cell blocks, exposing a portion of the sacrificial layer by removing the second isolation layer using the mask pattern as an etch mask, and forming air gaps in the trenches by removing the first region of the sacrificial layer through the open region.

9. A method of fabricating a nonvolatile memory device, the method comprising:

providing a substrate having active regions defined by a plurality of trenches and including at least two cell blocks;

forming a first isolation layer on the substrate;

forming a sacrificial layer on the first isolation layer to fill the plurality of trenches, the sacrificial layer including a first region filling lower portions of the trenches and a second region filling portions other than the lower portions;

removing the second region of the sacrificial layer;

forming a second isolation layer on the first isolation layer and on the first region of the sacrificial layer;

forming a mask pattern on the substrate, the mask pattern including an open region defined between the at least two cell blocks;

exposing a portion of the sacrificial layer by removing the second isolation layer using the mask pattern as an etch mask;

forming air gaps in the trenches by removing the first region of the sacrificial layer through the open region of the mask pattern; and forming a third isolation layer on the substrate to fill some of the plurality of trenches corresponding to the open region.

10. The method as claimed in claim 9, further comprising, after the filling of some of the trenches corresponding to the open region, removing a first portion of the first isolation layer and a first portion of the second isolation layer while maintaining the air gaps.

11. The method as claimed in claim 10, wherein the forming of the air gaps in the trenches comprises forming the air gaps such that a second portion of the first isolation layer and a second portion of the second isolation layer surround the air gaps.

12. The method as claimed in claim 11, further comprising, after the removing the first portion of the first isolation layer and the first portion of the second isolation layer, forming a second dielectric layer and word lines on the second portion of the first isolation layer and the second portion of the second isolation layer.

13. The method as claimed in claim 9, wherein the removing of the first region of the sacrificial layer comprises selectively removing the sacrificial layer using etching selectivity between the sacrificial layer and the second isolation layer.

14. The method as claimed in claim 9, wherein the providing of the substrate comprises sequentially stacking a first dielectric layer on the active regions and a charge storage floating pattern.

15. The method as claimed in claim 14, wherein the removing of the first region of the sacrificial layer comprises selectively removing the sacrificial layer using a first etching selectivity between the sacrificial layer and the second isolation layer and a second etching selectivity between the sacrificial layer and the charge storage floating pattern.

16. The method as claimed in claim 9, wherein the forming of the sacrificial layer comprises forming the sacrificial layer using a silicon hydrogen oxide or silicon nitride layer.

17. A method of fabricating a memory device, comprising:

forming a first trench and a second trench in a substrate;

forming a first insulating layer that covers interior surfaces of the first and second trenches, the first and second trenches with the first insulating layer therein defining respective voids below an upper surface of the substrate;

forming a sacrificial material layer, the sacrificial material layer being formed in the first trench such that the first insulating layer is between the sacrificial material layer and a wall of the first trench, the sacrificial material layer being formed in the second trench such that the first insulating layer is between the sacrificial material layer and a wall of the second trench, the sacrificial material layer at least partially filling the voids;

covering the first and second trenches with a second insulating layer, the second insulating layer entirely covering upper surfaces of the sacrificial material layer in the first and second trenches; and removing the sacrificial material layer from the first and second trenches so as to form air gaps in the first and second trenches, the sacrificial material layer being removed from the second trench while the second trench is covered with the second insulating layer such that the air gap in the second trench is below the second insulating layer; and covering the second insulating layer with a mask that has an opening over the first trench, and etching the second insulating layer so as to remove the second insulation layer above the first trench using the mask.

18. The method as claimed in claim 17, wherein removing the second insulating layer above the first trench using the mask is performed before removing the sacrificial layer from the first and second trenches.

19. The method as claimed in claim 17, wherein removing the second insulating layer above the first trench includes partially removing the second insulating layer from above the second trench such that the air gap in the second trench remains covered with a portion of the second insulating layer.

* * * * *